United States Patent [19]
Lee et al.

[11] Patent Number: 5,701,078
[45] Date of Patent: Dec. 23, 1997

[54] METHOD OF MEASURING RESIDUAL CAPACITY OF A NI/MH CELL

[75] Inventors: Jai-Young Lee; Hwan-Cheol Lee, both of Taijeon; Jon-Ha Lee, Cheolapuk-Do; Han-Ho Lee, Seoul; Dong-Myung Kim, Taijeon, all of Rep. of Korea

[73] Assignee: Korea Advanced Institute of Science and Technology, Taijeon, Rep. of Korea

[21] Appl. No.: 501,823

[22] Filed: Jul. 13, 1995

[30] Foreign Application Priority Data

Jul. 13, 1994 [KR] Rep. of Korea ............... 94-16809

[51] Int. Cl.$^6$ ............................................. G01N 27/27
[52] U.S. Cl. .......................... 324/430; 324/431; 320/43
[58] Field of Search ............................ 324/430, 431; 320/43

[56] References Cited

U.S. PATENT DOCUMENTS

| | | | |
|---|---|---|---|
| 3,676,770 | 7/1972 | Sharaf | 324/430 |
| 4,678,998 | 7/1987 | Muramatsu | 324/430 |
| 5,352,968 | 10/1994 | Reni | 324/430 |
| 5,404,106 | 4/1995 | Matsuda | 324/431 |

OTHER PUBLICATIONS

M. Doyle, et al., "Electrical Resistance and Hydrogen Solubility Anomalies in a Pd-8at. % Y Solid Solution Alloy," Journal of the Less-Common Metals, 130, 1987, pp. 79–87.

S. Filipek, et al., "The Influence of Hydrogen Absorption on the Electrical Resistance and Thermopower of Some Pd-Si-Based Metallic Glasses," Journal of the Less-Common Metals, 89, 1983, pp. 205–211.

W. E. Wallace, "Bonding of Metal Hydrides in Relation to the Characteristics of Hydrogen Storage Materials," Journal of the Less-Common Metals, 88, 1982, pp. 141–157.

*Primary Examiner*—Ernest F. Karlsen
*Assistant Examiner*—Jose M. Solis
*Attorney, Agent, or Firm*—Burns, Doane, Swecker & Mathis, L.L.P.

[57] ABSTRACT

The present invention relates to a method of measuring residual capacity of a Ni/MH (nickel/metal hydride) cell by measuring the change in the electrical resistivity of a Ni/MH cell according to the change of the concentration of hydrogen in metal hydride. According to the present invention, a method for measuring residual capacity of a Ni/MH cell comprises the steps of measuring electrical resistivity of a first Ni/MH cell, and determining the residual capacity of the first Ni/MH cell (i) from a predetermined data of n-pairs of electrical resistivity values and residual capacity values of a second Ni/MH cell which has substantially the same composition as the composition of the first Ni/MH cell, or (ii) based on a predetermined functional relationship between the electrical resistivity and residual capacity of the second Ni/MH cell. The series of the predetermined data or the predetermined functional relationship represents substantially a linear proportionally between the resistivity and the logarithmic value of the residual capacity. As the discharge reaction proceeds in the cell, metal hydride in the anode is reduced and loses hydrogen, and thus the hydrogen concentration at anode becomes lower. Accordingly, the relationship between the residual capacity and the resistivity of a Ni/MH cell can be obtained by measuring the residual capacity and the resistivity of the cell depending on the degree of discharge, therefore the residual capacity can be readily detected by measuring only the resistivity of the cell.

17 Claims, 11 Drawing Sheets

Fig. 3

| Ser. No. | Resistivity (Ω·m) | Residual Capacity (mAh) |
|---|---|---|
| 1 | $R_1$ | $C_1$ |
| 2 | $R_2$ | $C_2$ |
| 3 | $R_3$ | $C_3$ |
| ⋮ | ⋮ | ⋮ |
| m | $R_m$ | $C_m$ |

METHOD OF MEASURING RESIDUAL CAPACITY OF A NI/MH CELL

BACKGROUND OF THE INVENTION

The present invention relates to a method of measuring residual capacity of a rechargeable cell, and more particularly to a method of measuring residual capacity of a Ni/MH (Nickel/Metal Hydride) rechargeable cell which will constitute the majority of future rechargeable cells, by using the change in electrical resistivity of a Ni/MH cell according to the change of its residual capacity.

Rechargeable cells which are commercially used these days are lead-acid cells, Ni/Cd (nickel/cadmium) cells, and so on. However, rechargeable cells with higher capacity have been required in accordance with the miniaturization and the lighter weights of electronic equipments and the advancement in the research of electric automobiles. An electronic cell which has been developed to satisfy such needs is the nickel/metal hydride (Ni/MH) cell. Ni/MH cell is free from the problem of environment pollution and has a high energy density. Thus, it is expected to capture the majority of the market for commercial rechargeable cells in two or three years.

If the aforementioned Ni/MH cell is used as a power supply for electric automobiles which are being actively studied at present, it is important to know its residual capacity. If a Ni/MH cell is to be employed in the power supply of home electronics goods, it would be necessary for the consumers to know the residual capacity of the cell. If it is not known whether the cell is charged or discharged, or the residual capacity of the cell is unknown until the cell is completely discharged, it becomes hard to estimate the time to recharge and to prepare for the recharge. As a result, electric automobiles and home electronics goods may unexpectedly stop operation, which will cause much inconvenience. Further, it is impossible to use the cell in job assignments which require much power while taking the residual capacity of the cell into account if the residual capacity cannot be detected. Japanese laid-open patent publication Nos. hei4-236379, hei4-267077 and hei5-5429 disclose the technology regarding apparatuses which measure the residual capacity or count the number of rechargings of rechargeable cells based on the change in its current or voltage. However, the prior arts do not teach how to measure the residual capacity of a Ni/MH cell associated with its material properties.

In a conventional Ni/Cd cell or lead-acid cell, the pH (the concentration of hydrogen ions) of the electrolyte changes according to the residual capacity of the cell during charge or discharge. Thus, the residual capacity of the cell can be detected by measuring the pH value. However, a Ni/MH cell consumes and generates water ($H_2O$) at the anode and cathode respectively, as can be understood in view of the following equations. Therefore, the pH of the electrolyte does not change. Accordingly, it is impossible to measure the residual capacity of a Ni/MH cell based on the pH value of the electrolyte, unlike in conventional cells.

Anode: 

Cathode: 

The residual capacity of Ni/MH rechargeable cell may be detected using a discharger, an apparatus to discharge a cell or cells. When a Ni/MH cell is discharged in a constant current by a discharger, one can measure the time required to complete the discharge, whereby the residual capacity can be obtained based on the measured values by multiplying the current of the discharge and the time taken to complete discharge. However, in this case, the residual capacity can be measured only if the cell is completely discharged, thus it has the problem that the cell should be recharged to be usable after the residual capacity is measured. In addition, this method does not meet the purpose of measuring the residual capacity of the cell which is to use the cell depending on the measured residual capacity.

SUMMARY OF THE INVENTION

According to the present invention, as a result of various experiments, the residual capacity of Ni/MH cells can be detected by measuring the change in the electric resistivity of the cell, in accordance with the change in the concentration of hydrogen contained in the MH (metal hydride) which is used as the anode of the Ni/MH cell. The term "cell" used in this specification means an apparatus which create the electric potential difference between electrodes, and is not limited by particular types of applications.

Accordingly, the purpose of the present invention is to provide a method of measuring the residual capacity of a Ni/MH cell, which cannot be measured by using the method of measuring the residual capacity of conventional rechargeable cells.

According to one aspect of the present invention, the foregoing purpose can be accomplished by a method of measuring the residual capacity of a nickel/metal hydride (Ni/MH) cell which comprises the steps of: (i) measuring electrical resistivity of a first Ni/MH cell; and (ii) determining the residual capacity of said first Ni/MH cell from said electrical resistivity of said first Ni/MH cell based on a predetermined functional relationship between the electrical resistivity and residual capacity of a second Ni/MH cell which has substantially the same composition as the composition of said first Ni/MH cell, wherein said predetermined functional relationship represents substantially linear proportionality between the resistivity and the logarithmic value of the residual capacity.

As a discharge reaction proceeds in a Ni/MH cell, metal hydride in the anode is reduced and loses hydrogen, and thus the hydrogen concentration at the anode becomes lower. It is a basic property of metal hydrides that the resistivity becomes lower as the hydrogen concentration in the metal hydride becomes lower (See M. Doyle, et al., "Electrical Resistance and Hydrogen Solubility Anomalies in a Pd-8at. % Y Solid Solution Alloy," Journal of the Less-Common Metals, 130, 1987, pp. 79–87; S. Filipek, et al., "The Influence of Hydrogen Absorption on the Electrical Resistance and Thermopower of Some Pd-Si-Based Metallic Glasses," Journal of the Less-Common Metals, 89, 1983, pp. 205–211; and W. E. Wallace, "Bonding of Metal Hydrides in Relation to the Characteristics of Hydrogen Storage Materials," Journal of the Less-Common Metals, 88, 1982, pp. 141–157).

Accordingly, the hydrogen concentration at the anode becomes higher as the residual capacity of a Ni/MH cell becomes higher, thus the resistivity becomes higher. According to a method of the present invention, the relationship between the residual capacity and the resistivity of Ni/MH rechargeable cell can be obtained by measuring the residual capacity and the resistivity of the cell depending on the degree of discharge. Therefore, the residual capacity can be detected by measuring only the resistivity of the cell.

BRIEF DESCRIPTION OF THE DRAWINGS

The foregoing and other objects, features and advantages of the present invention will be apparent from the following description of a preferred embodiment of the present invention, as illustrated in the accompanying drawings.

FIG. 3 shows an example of a look-up table according to the present invention.

DETAILED DESCRIPTION OF PREFERRED EMBODIMENTS

Figure 1:
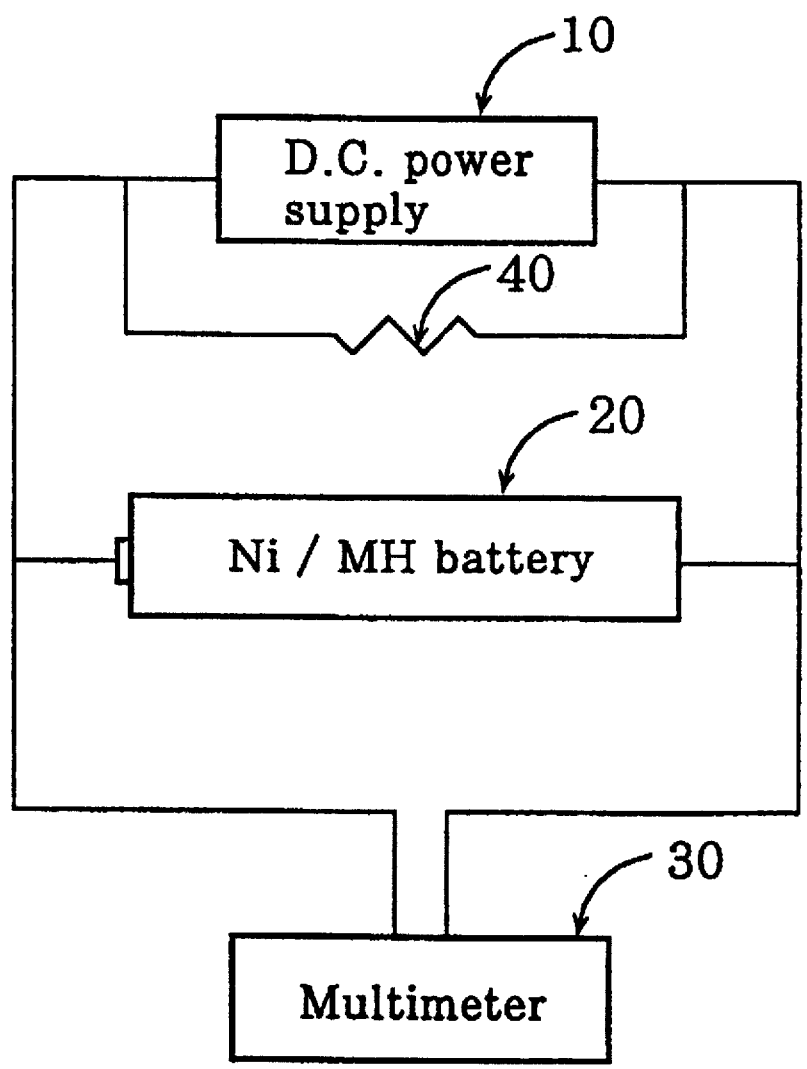
FIG. 1 shows an apparatus for measuring the residual capacity of a Ni/MH cell according to the present invention.

FIG. 1 shows an apparatus for measuring the residual capacity of a Ni/MH cell according to the present invention. The apparatus comprises means for retaining a Ni/MH cell 20, a DC power supply 10 which is connected serially to the means for retaining the Ni/MH cell 20, and a multimeter 30, which is connected in parallel to the means for retaining a Ni/MH cell 20, for measuring the change of the electrical resistivity across both electrodes of the cell. For example, a Ni/MH cell may be an AA-size cell having a capacity of about 1100 mAh.

According to a preferred embodiment of the present invention, when a fully-charged Ni/MH cell was predetermined constant current, the resistance across both electrodes (anode and cathode) was measured by multimeter 30. Thereafter, the time required to fully discharge the cell was measured, and the residual capacity of the cell at the time of measuring the resistance was calculated by multiplying the predetermined value of the discharging current and the time to fully discharge the cell. The measured value of resistance was converted into the corresponding resistivity value, and the relation between the resistivity and the residual capacity was obtained. The resistivity of the cell may be measured directly by appropriate measurement methods such as the four-point probe technique, without measuring the resistance of the cell as described above. Such measurements were made several times at different levels of the degree of discharge.

In order to ensure the reproducibility and applicability of the present invention, this discharge experiment was carried out for three kinds of Ni/MH cells which have different compositions, i.e. $MmNi_{3.45}(CoMnTi)_{1.55}$, $MmNi_{3.5}(CoMnTi)_{1.5}$, and $Mm_{1.1}Ni_{3.25}CoAl_{0.75}$. "Mm" refers to "misch metal," which is an alloy consisting of a crude mixture of cerium, lanthanum, and other rare-earth metals obtained by electrolysis of the mixed chlorides of the metals dissolved in fused sodium chloride. According to the preferred embodiment of the present invention, Mm has the composition of: 28 wt. % of La; 40 wt. % of Ce; 4 wt. % of Pr; 14 wt. % of Nd; 2 wt. % of the mixture of Al, Ca and Mg; 5 wt. % of Fe; and other rare-earth materials. This composition of misch metal may vary without affecting the electrical or electronic property of the material. As a result, the data measured as to three Ni/MH cells having different compositions represented substantially same relationships between the residual capacity and the resistivity, as shown in FIG. 2.

Figure 2:
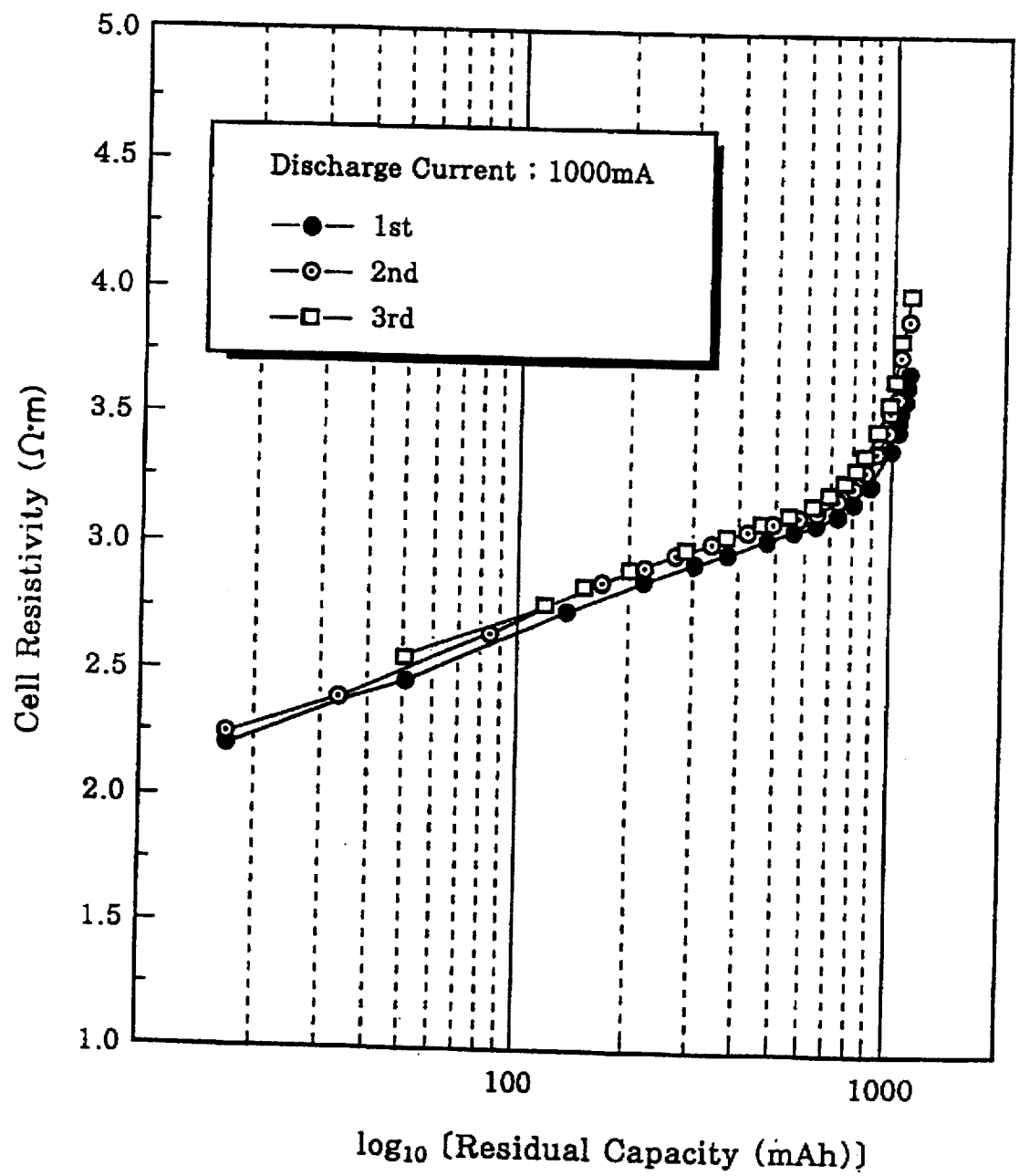
FIG. 2 shows a graph illustrating the resistivity-$\log_{10}$ (residual capacity) relation which is obtained by the present invention.
Figure 4:
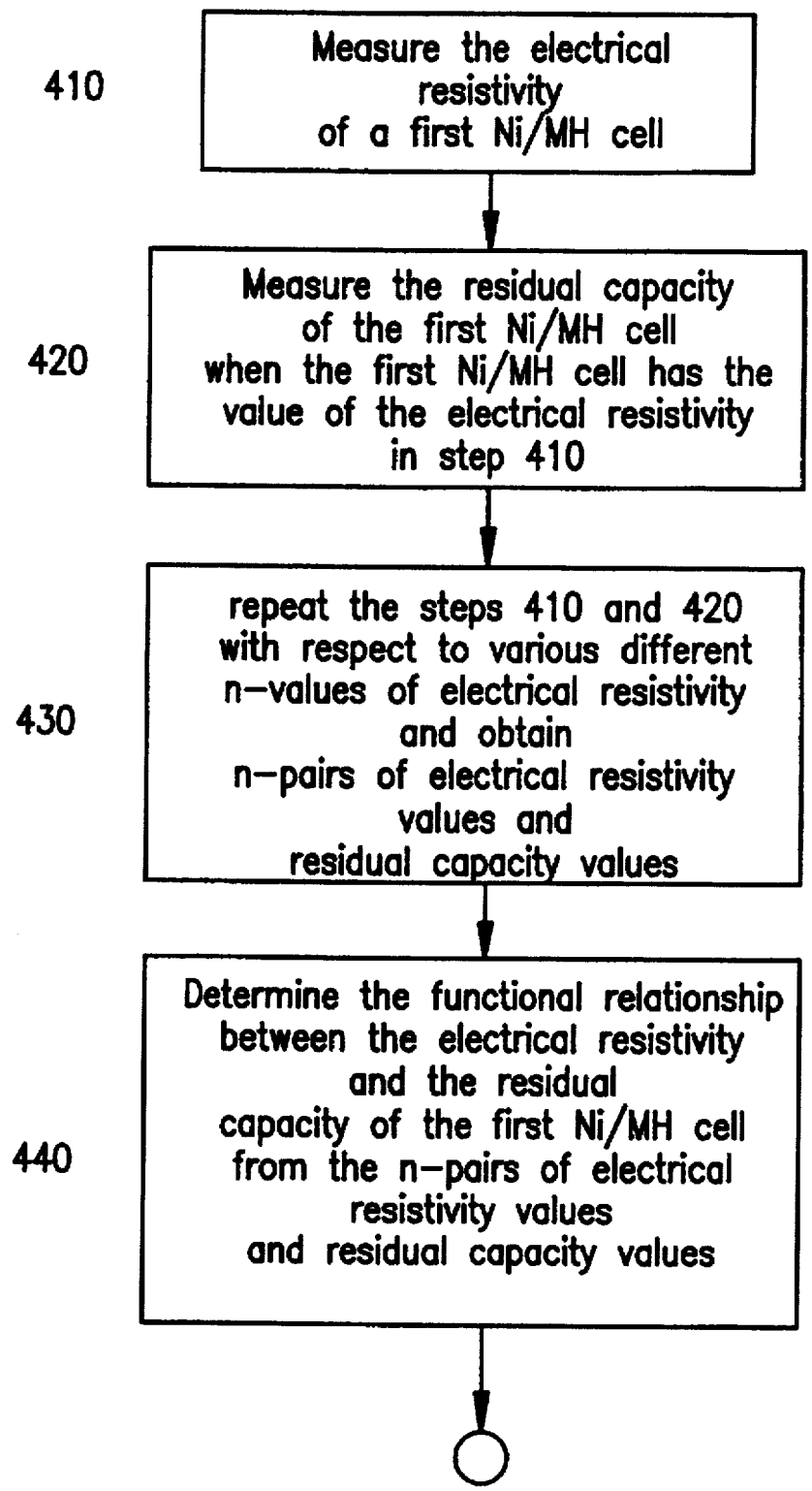
FIG. 4 schematically shows an example of the method of measuring residual capacity of a Ni/MH cell according to the present invention, which is based on the measured electrical resistivity and a functional relationship between the residual capacity and the electrical resistivity.
Figure 4:
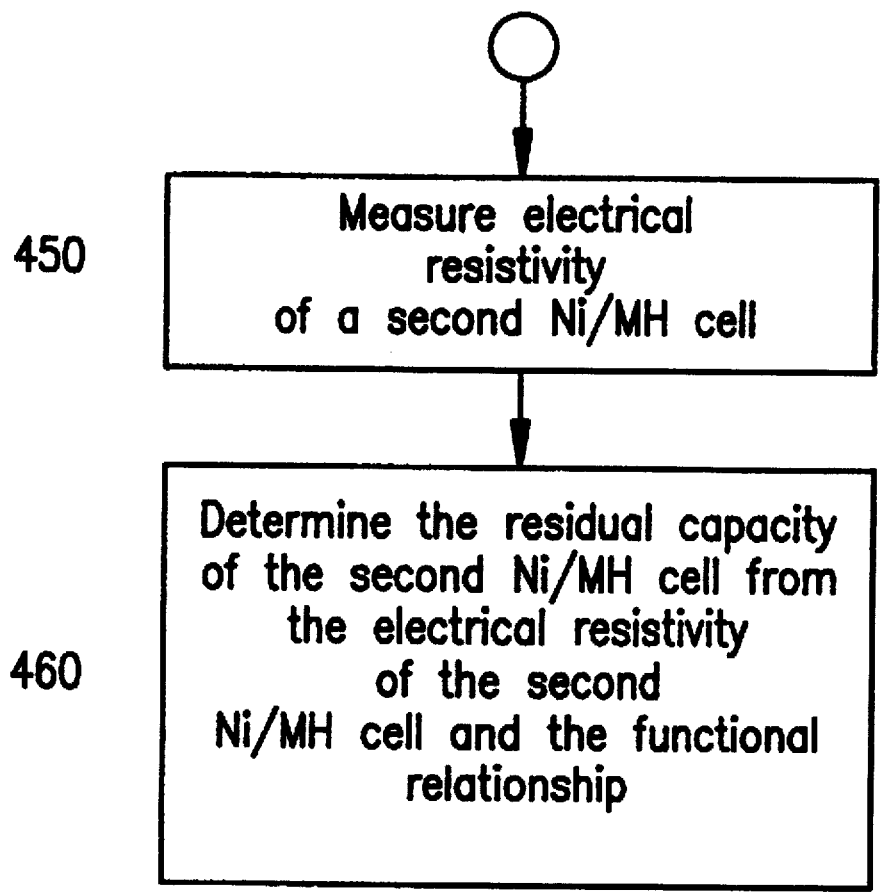

FIG. 2 illustrates a graph representing the relationship between the residual capacity and the resistivity of the Ni/MH rechargeable cell according to a method of the present invention. It can be noted from the graph that the resistivity increases as the residual capacity of a Ni/MH cell increases. It can also be noted from the graph that the relationship between the value of the resistivity and the value of $\log_{10}$(Residual Capacity) represents linearity to 90% of the total capacity of the cell. This means that the residual capacity of a Ni/MH cell can be measured based on the measurement of the change of the electrical resistivity of a Ni/MH cell according to the present invention. The residual capacity of a Ni/MH cell can be measured from the measured electrical resistivity and a functional relationship such as linearity between the residual capacity and the electrical resistivity. FIG. 4 schematically shows a method of measuring residual capacity of a Ni/MH cell from the measured electrical resistivity and a functional relationship between the residual capacity and the electrical resistivity.

It will be appreciated by those skilled in the art that the residual capacity of a Ni/MH cell can be readily detected by the embodiments of the present invention described above. The residual capacity of a Ni/MH cell can be obtained by other examples according to the principles of the present invention as explained below.

(1) Instead of obtaining a functional relationship between the electrical resistivity of the Ni/MH cell and its residual capacity, one can create a look-up table with respect to the data of the electrical resistivity and the corresponding residual capacity. FIG. 3 illustrates an example of a look-up table according to the present invention. The look-up table may be stored in ROM, RAM, and other storage means and the stored data may be processed electronically.

Figure 5:
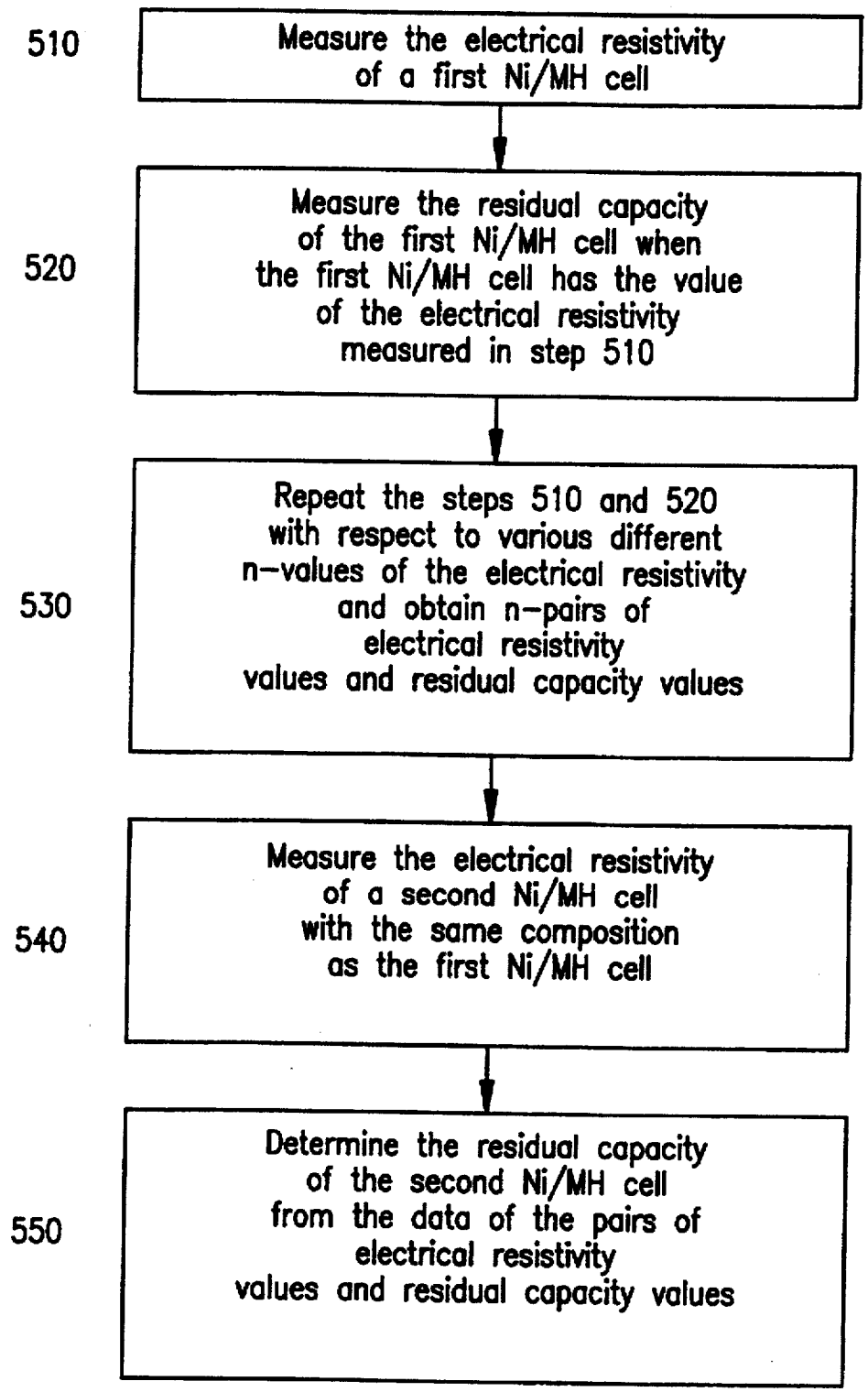
FIG. 5 schematically shows an example of the method of measuring residual capacity of a Ni/MH cell according to the present invention, which is directly based on the data pairs of electrical resistivity values and residual capacity values.

Further, the residual capacity may be detected directly from the data of the pairs of the measured values without making a look-up table. For determining the residual capacity directly from the data n-pairs of the measured values without making a look-up table, the measuring method according to the present invention comprises the steps of (i) measuring the electrical resistivity of a first Ni/MH cell; (ii) measuring the residual capacity of the first Ni/MH cell when the first Ni/MH cell has the value of the electrical resistivity measured in the step (i); (iii) repeating the steps (i) and (ii) with respect to various different n-values of the electrical resistivity (n is an integer) and obtaining n-pairs of electrical resistivity values and residual capacity values; (iv) measuring the electrical resistivity of a second Ni/MH cell which has substantially the same composition as the composition of the first Ni/MH cell; and (v) determining the residual capacity of the second Ni/MH cell which corresponds to the electrical resistivity of the second Ni/MH cell from the data of the pairs of electrical resistivity values and residual capacity values. FIG. 5 schematically shows a method of measuring residual capacity of a Ni/MH cell directly based on such data pairs.

Figure 6:
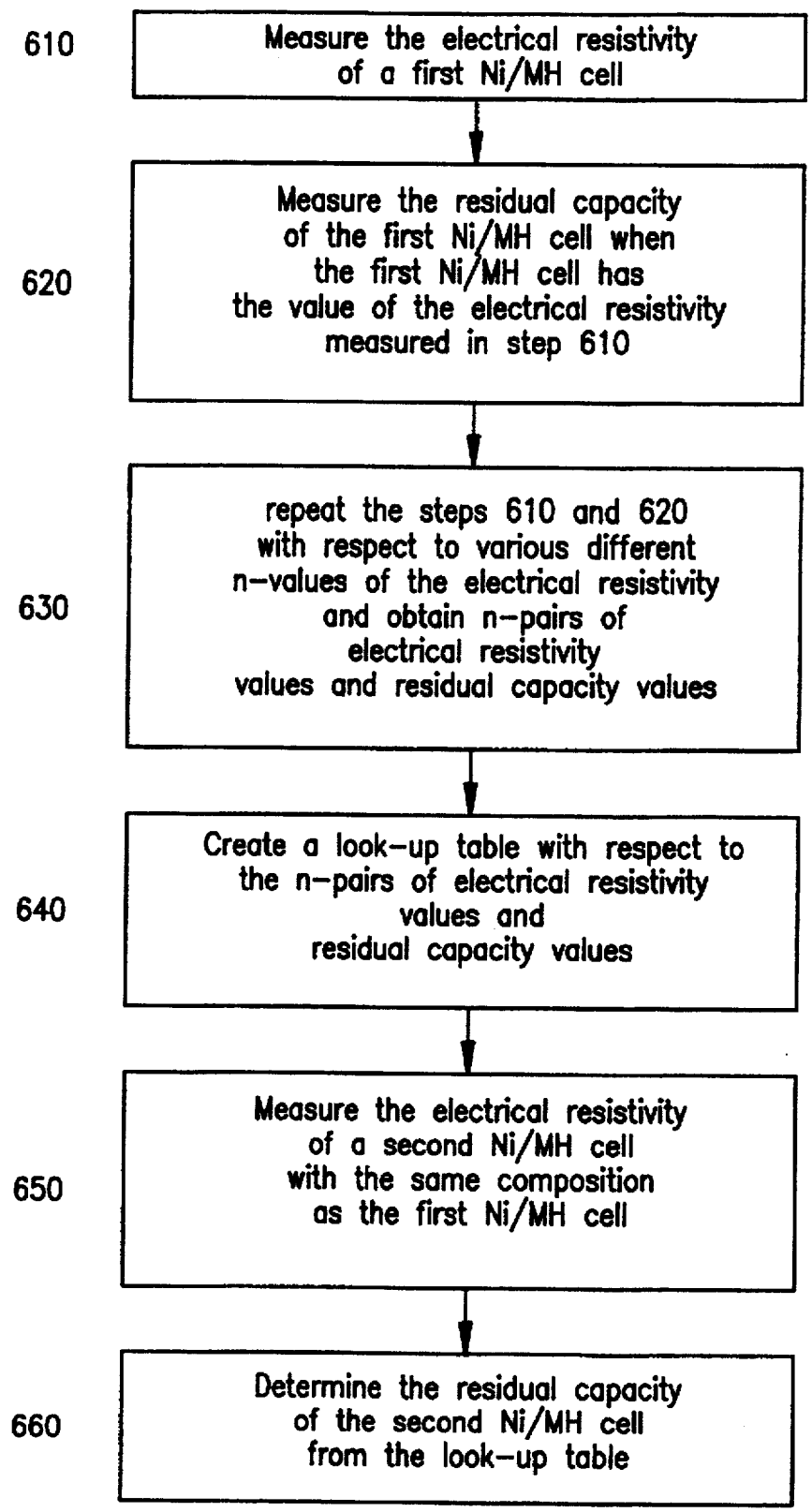
FIG. 6 schematically shows an example of the method of measuring residual capacity of a Ni/MH cell according to the present invention, which uses a look-up table.

In case of creating a look-up table, the step (iii) described above will further comprise the step of (vi) creating a look-up table with respect to the n-pairs of electrical resistivity values and residual capacity values, and the step (v) described above will further comprise the step of (vii) determining the residual capacity of the second Ni/MH cell which corresponds to the electrical resistivity the second Ni/MH cell from the look-up table. FIG. 6 schematically shows a method of measuring residual capacity of a Ni/MH cell using a look-up table.

(2) Without measuring both the residual capacity and the electrical resistivity one of theses values may be predetermined. In this case, the predetermined value may include variously different n-values (n is an integer), and the other one needs to be measured.

Figure 7:
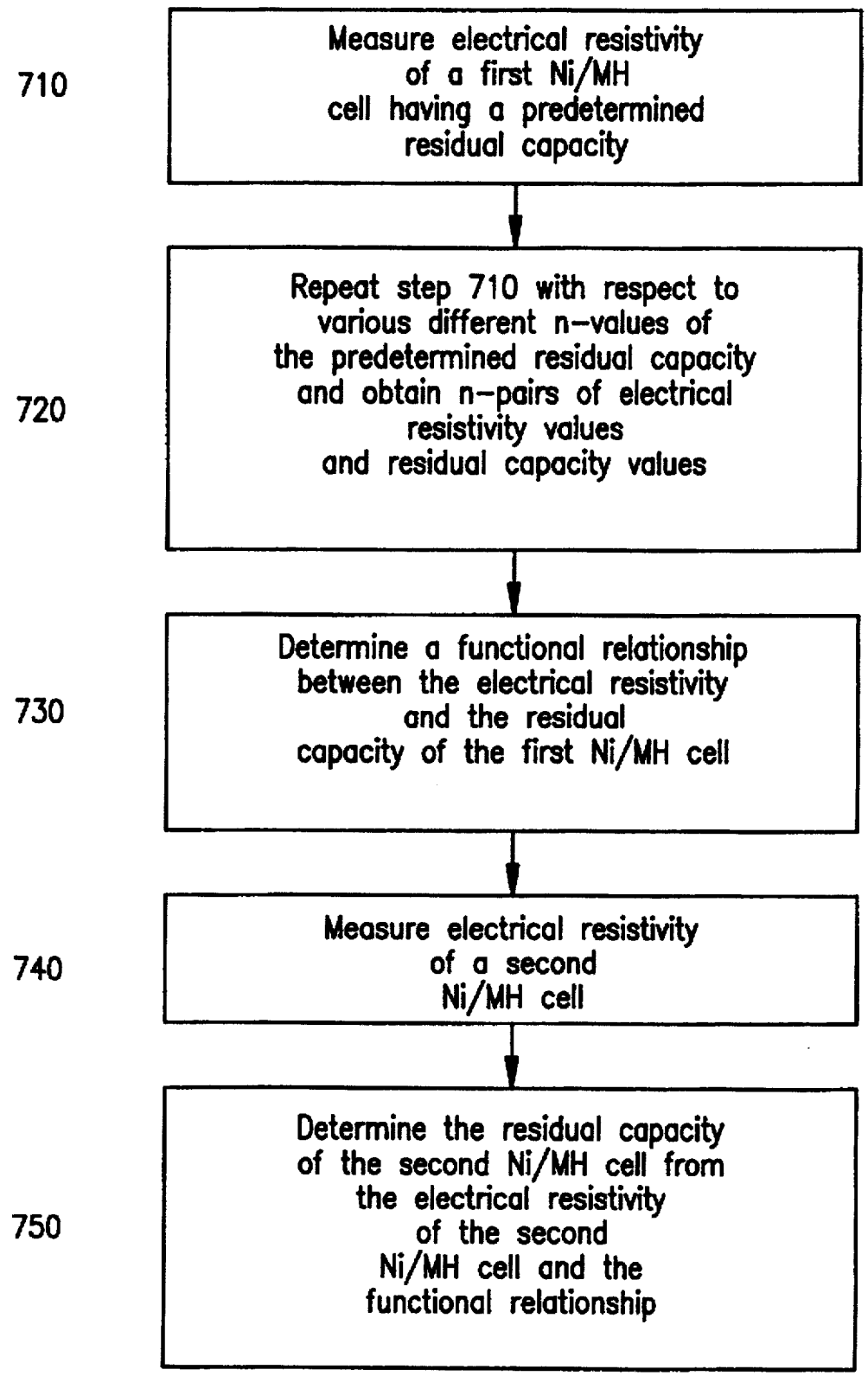
FIG. 7 schematically shows an example of the method of measuring residual capacity of a Ni/MH cell when the values of the residual capacity are predetermined.

If the n-values of the residual capacity are predetermined, the measuring method according to the present invention comprises the steps of (i) measuring electrical resistivity of a first Ni/MH cell having a predetermined residual capacity; (ii) repeating the step (i) with respect to various different n-values of the predetermined residual capacity and obtaining n-pairs of electrical resistivity values and residual capacity values; (iii) obtaining an functional relationship between the electrical resistivity and the residual capacity of the first Ni/MH cell from the n-pairs of electrical resistivity values and residual capacity values; (iv) measuring electrical resistivity of a second Ni/MH cell which has substantially the same composition as the composition of the first Ni/MH cell; and (v) obtaining the residual capacity of the second Ni/MH cell from the electrical resistivity of the second Ni/MH cell and the functional relationship. FIG. 7 schematically shows a method of measuring residual capacity of a Ni/MH cell when the values of the residual capacity are predetermined.

Figure 8:
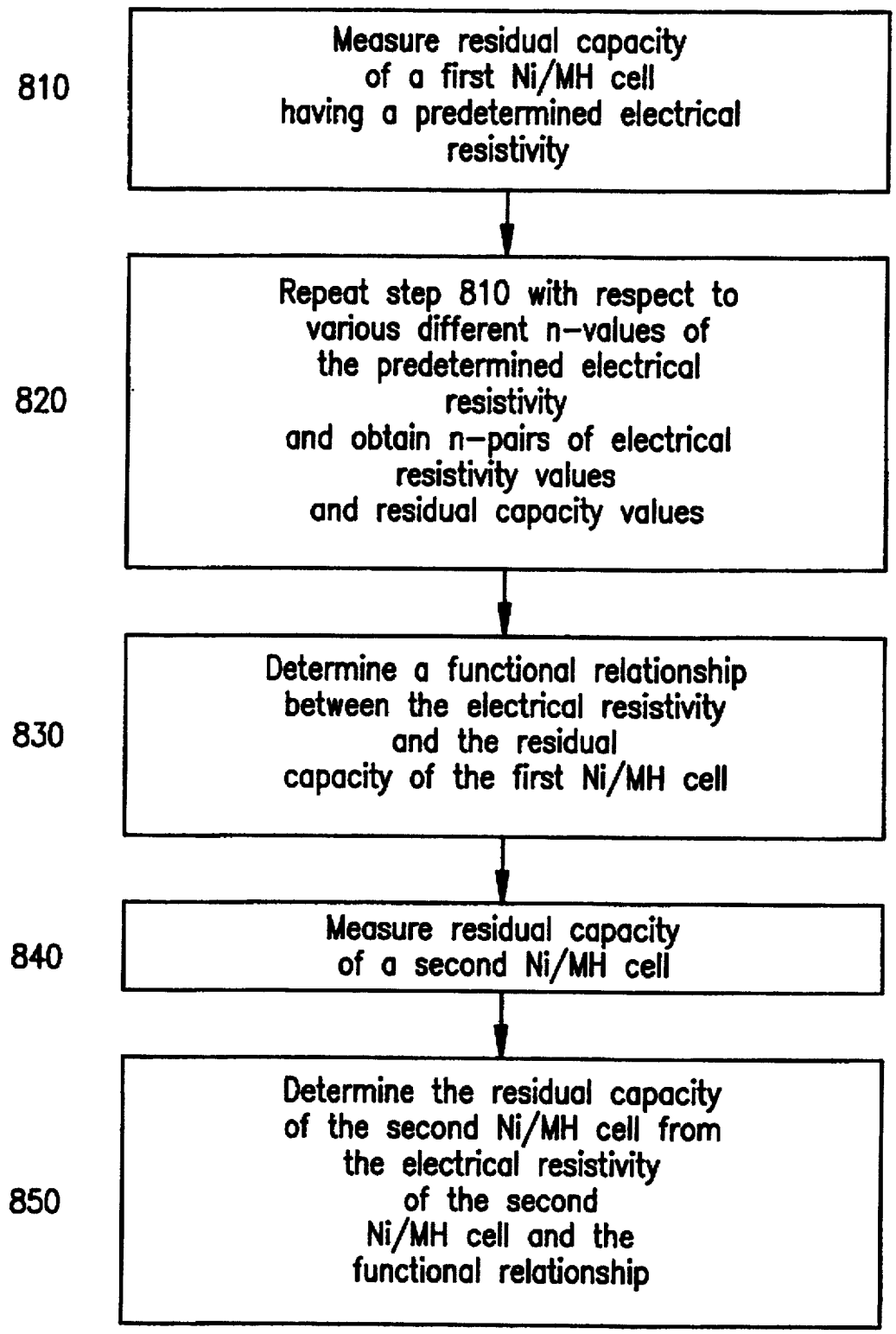
FIG. 8 schematically shows an example of the method of measuring residual capacity of a Ni/MH cell when the values of the electrical resistivity are predetermined.

If the n-values of the electrical resistivity are predetermined, the measuring method according to the present invention comprises the steps of (i) measuring residual capacity of a first Ni/MH cell having predetermined electrical resistivity; (ii) repeating the step (i) with respect to various different n-values of predetermined electrical resistivity and obtaining n-pairs of electrical resistivity values and residual capacity values; (iii) determining the functional relationship between the electrical resistivity and the residual capacity of the first Ni/MH cell from the n-pairs of electrical resistivity values and residual capacity values; (iv) measuring electrical resistivity of a second Ni/MH cell which has substantially the same composition as the composition of the first Ni/MH cell; and (v) determining the residual capacity of the second Ni/MH cell from the electrical resistivity of the second Ni/MH cell and the functional relationship. FIG. 8 schematically shows a method of measuring residual capacity of a Ni/MH cell when the values of the electrical resistivity are predetermined.

(3) Further, one of the residual capacity and the electrical resistivity may be predetermined while creating a look-up table. As in the above cases, the look-up table may be stored in ROM, RAM, or other storage means. The stored data may also be processed electronically. Further, the predetermined value may include variously different n-values (n is an integer), and the other one only need to be measured.

Figure 9:
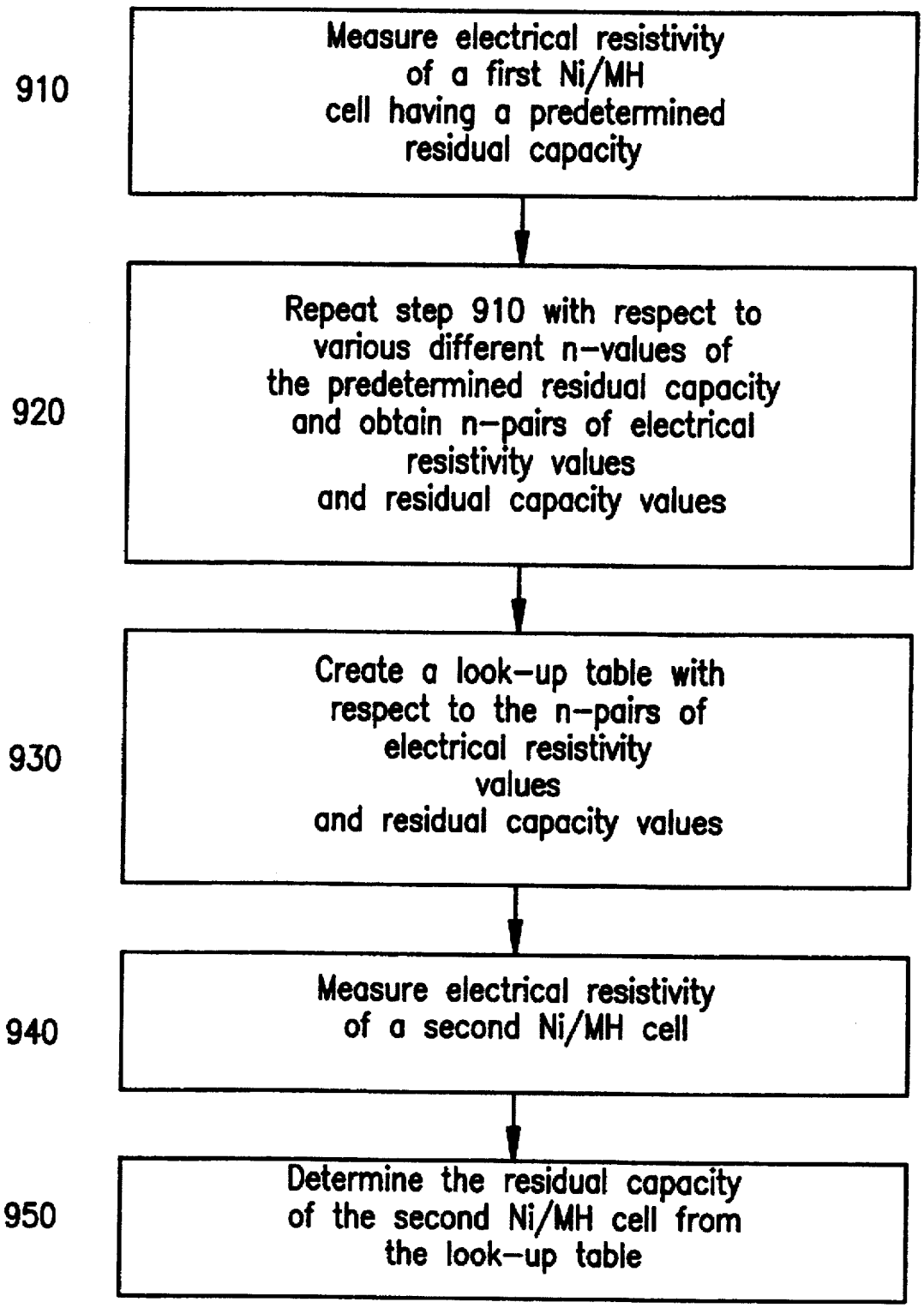
FIG. 9 schematically shows an example of the method of measuring residual capacity of a Ni/MH cell by a look-up table when the values of the residual capacity are predetermined.

If the n-values of the residual capacity are predetermined for creating a look-up table, the measuring method according to the present invention comprises the steps of (i) measuring electrical resistivity of a first Ni/MH cell having a predetermined residual capacity; (ii) repeating the step (i) with respect to various different n-values of the predetermined residual capacity and obtaining n-pairs of electrical resistivity values and residual capacity values; (iii) creating a look-up table with respect to the n-pairs of electrical resistivity values and residual capacity values; (iv) measuring the electrical resistivity of a second Ni/MH cell which has substantially the same composition as the composition of the first Ni/MH cell; and (v) determining the residual capacity of the second Ni/MH cell which corresponds to the electrical resistivity of the second Ni/MH cell from the look-up table. FIG. 9 schematically shows a method of measuring residual capacity of a Ni/MH cell by a look-up table while the values of the residual capacity are predetermined.

Figure 10:
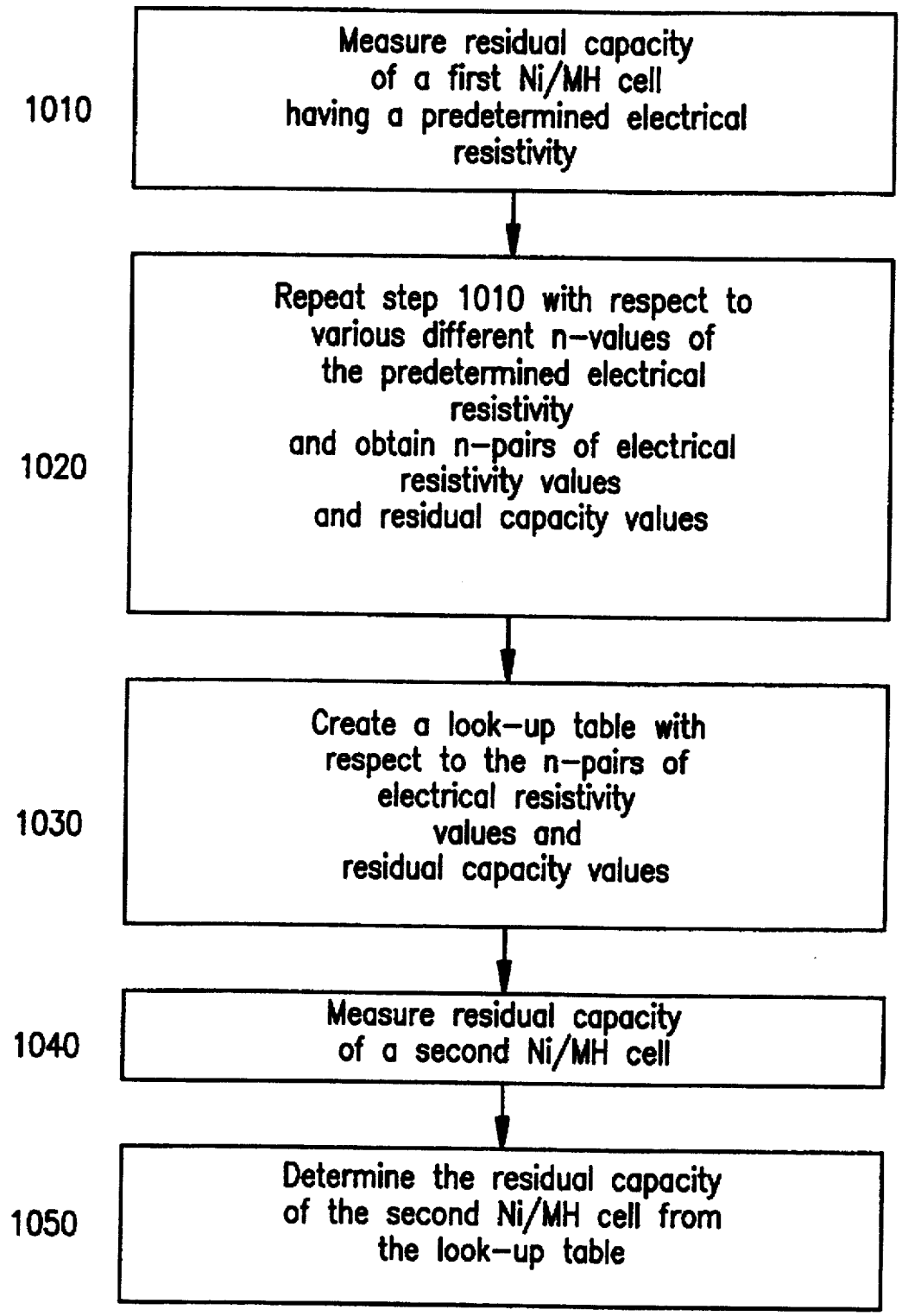
FIG. 10 schematically shows an example of the method of measuring residual capacity of a Ni/MH cell by a look-up table when the values of the electrical resistivity are predetermined.

If one has n-values of the electrical resistivity predetermined while making a look-up table, the measuring method according to the present invention comprises the steps of (i) measuring residual capacity of a first Ni/MH cell having a predetermined electrical resistivity; (ii) repeating the step (i) with respect to various different n-values of the predetermined electrical resistivity and obtaining n-pairs of electrical resistivity values and residual capacity values; (iii) creating a look-up table with respect to the n-pairs of electrical resistivity values and residual capacity values; (iv) measuring the electrical resistivity of a second Ni/MH cell which has substantially the same composition as the composition of the first Ni/MH cell; and (v) determining the residual capacity of the second Ni/MH cell which corresponds to the electrical resistivity of the second Ni/MH cell from the look-up table. FIG. 10 schematically shows a method of measuring residual capacity of a Ni/MH cell by a look-up table where the values of the electrical resistivity are predetermined.

(4) A predetermined functional relationship between the residual capacity and the resistivity of a Ni/MH cell also can be obtained from a function formed by plotting measured electrical resistivity of a Ni/MH cell for each value of the residual capacity at various states of discharge. It will be noted that the predetermined functional relationship which can be obtained from a function formed by plotted measured electrical resistivity, for example, as depicted in FIG. 2, may have the formation of n-pairs of values of the residual capacity and the resistivity, and one can create a look-up table based on such functional relationship.

The present invention includes the discovery that the residual capacity of a Ni/MH rechargeable cell can be readily detected by obtaining the value of the resistivity based on the relationship between the residual capacity and the electrical resistivity as shown in FIG. 2, which is novel and inventive over the conventional methods for measuring a residual capacity of a Ni/MH cell.

As previously described, the present invention will be found to be useful in that the residual capacity of a Ni/MH rechargeable cell can be measured by measuring the electrical resistivity, which has been impossible by the pH measurement used for measuring the residual capacity of the conventional rechargeable cells.

Although the present invention is described with respect to particular embodiments thereof, it will be apparent to those skilled in the art that various applications and modifications can be readily made without departing from the scope of the above-described principles and features of the present invention. For example, the method according to the present invention can be accomplished electrically or electronically by means of proper circuitry. Moreover, the method of measuring the residual capacity of a Ni/MH cell according to the present invention may be applied to an apparatus for measuring the residual capacity such as disclosed in Japanese laid-open patent publication Nos. hei4-236379 and hei5-45429 which are herein described as prior art, and it may be employed to display the residual capacity of a Ni/MH cell by measuring the resistivity of the cell, instead of measuring the current or the voltage.

Therefore, the present invention should not be interpreted to be limited to the above described embodiments and is only restricted to the appended claims.

We claim:

1. A method of measuring residual capacity of a nickel/metal hydride (Ni/MH) cell comprising the steps of:
   (i) measuring electrical resistivity of a first Ni/MH cell; and
   (ii) determining the residual capacity of said first Ni/MH cell from said electrical resistivity of said first Ni/MH cell based on a predetermined functional relationship between the electrical resistivity and residual capacity of a second Ni/MH cell which has substantially the same composition as the composition of said first Ni/MH cell, wherein said predetermined functional relationship represents substantially a linear proportionality between the resistivity and the logarithmic value of the residual capacity.

2. A method of measuring residual capacity of a Ni/MH cell according to claim 1, wherein said step (i) further comprises the steps of:
   (iii) measuring electrical resistivity of a second Ni/MH cell;
   (iv) measuring residual capacity of said second Ni/MH cell when said second Ni/MH cell has the value of said electrical resistivity measured in said step (iii);
   (v) repeating said steps (iii) and (iv) with respect to various different n-values of electrical resistivity (n is an integer) and obtaining n-pairs of electrical resistivity values and residual capacity values, and
   said predetermined functional relationship is determined from said n-pairs of electrical resistivity values and residual capacity values.

3. A method of measuring residual capacity of a Ni/MH cell according to claim 2, wherein said step (iv) further comprises the steps of:
   (vi) measuring the time required to fully discharge said second Ni/MH cell having the value of said electrical resistivity measured in said step (iii) at a given constant current; and
   (vii) determining residual capacity of said second Ni/MH cell by multiplying said constant current and said time required to fully discharge said second Ni/MH cell.

4. A method of measuring residual capacity of a Ni/MH cell according to claim 1, wherein said step (i) further comprises the steps of:
   (iii) measuring electrical resistivity of a second Ni/MH cell having a predetermined residual capacity; and
   (iv) repeating said step (iii) with respect to various different n-values of predetermined residual capacity and obtaining n-pairs of electrical resistivity values and residual capacity values, and
   wherein said predetermined functional relationship is determined from said n-pairs of electrical resistivity values and residual capacity values.

5. A method of measuring residual capacity of a Ni/MH cell according to claim 1, wherein said step (i) further comprises the steps of:
   (iii) measuring residual capacity of a second Ni/MH cell having predetermined electrical resistivity; and
   (iv) repeating said step (iii) with respect to various different n-values of predetermined electrical resistivity and obtaining n-pairs of electrical resistivity values and residual capacity values, and
   wherein said predetermined functional relationship is determined from said n-pairs of electrical resistivity values and residual capacity values.

6. A method of measuring residual capacity of a nickel/metal hydride (Ni/MH) cell comprising the steps of:
   (i) measuring electrical resistivity of a first Ni/MH cell; and
   (ii) determining the residual capacity of said first Ni/MH cell which corresponds to said electrical resistivity of said first Ni/MH cell from a predetermined data of n-pairs of electrical resistivity values and residual capacity values of a second Ni/MH cell which has substantially the same composition as the composition of said first Ni/MH cell, wherein said predetermined data represents substantially a linear proportionality between the resistivity and the logarithmic value of the residual capacity.

7. A method of measuring residual capacity of a Ni/MH cell according to claim 6, wherein said step (ii) further comprises the steps of:
   (iii) creating a look-up table with respect to said predetermined data of n-pairs of electrical resistivity values and residual capacity values; and
   (iv) determining the residual capacity of said first Ni/MH cell which corresponds to said electrical resistivity of said first Ni/MH cell from said look-up table.

8. A method of measuring residual capacity of a Ni/MH cell according to claim 1, 2, 3, 4, or 5, wherein the composition of metal in said metal hydride in said Ni/MH cell is substantially $MmNi_{3.45}(CoMnTi)_{1.55}$(Mm refers to misch metal).

9. A method of measuring residual capacity of a Ni/MH cell according to claim 1, 2, 3, 4, or 5, wherein the composition of metal in said metal hydride in said Ni/MH cell is substantially $MmNi_{3.5}(CoMnTi)_{1.5}$(Mm refers to misch metal).

10. A method of measuring residual capacity of a Ni/MH cell according to claim 1, 2, 3, 4, or 5, wherein the composition of metal in said metal hydride in said Ni/MH cell is substantially $Mm_{1.1}Ni_{3.25}CoAl_{0.75}$(Mm refers to misch metal).

11. A method of measuring residual capacity of a Ni/MH cell according to claim 6 or claim 7, wherein the composition of metal in said metal hydride in said Ni/MH cell is substantially $Mm_{3.5}Ni_{1.1}CoAl_{0.75}$(Mm refers to misch metal).

12. A method of measuring residual capacity of a Ni/MH cell according to claim 6 or claim 7, wherein the composition of metal in said metal hydride in said Ni/MH cell is substantially $MmNi_{3.45}(CoMnTi)_{1.55}$(Mm refers to misch metal).

13. A method of measuring residual capacity of a Ni/MH cell according to claim 6 or claim 7, wherein said predetermined data of n-pairs of electrical resistivity values and residual capacity values are determined by:
   (v) measuring electrical resistivity of said second Ni/MH cell;

(vi) measuring residual capacity of said second Ni/MH cell when said second Ni/MH cell has the value of said electrical resistivity measured in said step (v); and (vii) repeating said steps (v) and (vi) with respect to various different n-values of electrical resistivity (n is an integer).

14. A method of measuring residual capacity of a Ni/MH cell according to claim 13, wherein said step (vi) further comprises the steps of:

(viii) measuring the time required to fully discharge said second Ni/MH cell having the value of said electrical resistivity measured in said step (vi) at a given constant current; and (ix) determining residual capacity of said second Ni/MH cell by multiplying said constant current and said time required to fully discharge said second Ni/MH cell.

15. A method of measuring residual capacity of a Ni/MH cell according to claim 6 or claim 7, wherein said predetermined data of n-pairs of electrical resistivity values and residual capacity values are determined by:

(v) measuring electrical resistivity of said second Ni/MH cell having a predetermined residual capacity; and (vi) repeating said step (v) with respect to various different n-values of predetermined residual capacity.

16. A method of measuring residual capacity of a Ni/MH cell according to claim 6 or claim 7, wherein said predetermined data of n-pairs of electrical resistivity values and residual capacity values are determined by:

(v) measuring residual capacity of said second Ni/MH cell having predetermined electrical resistivity; and (vi) repeating said step (v) with respect to various different n-values of predetermined electrical resistivity.

17. A method of measuring residual capacity of a Ni/MH cell according to claim 6 or claim 7, wherein the composition of metal in said metal hydride in said Ni/MH cell is substantially $MmNi_{3.5}(CoMnTi)_{1.5}$ (Mm refers to misch metal).

* * * * *